(12) United States Patent
Yeh et al.

(10) Patent No.: US 8,016,372 B2
(45) Date of Patent: Sep. 13, 2011

(54) COMPUTER ENCLOSURE WITH EMI SHIELDING CLIP

(75) Inventors: Chin-Wen Yeh, Taipei Hsien (TW); Zhi-Jian Peng, Shenzhen (TW)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 12/712,179

(22) Filed: Feb. 24, 2010

(65) Prior Publication Data

US 2011/0127890 A1    Jun. 2, 2011

(30) Foreign Application Priority Data

Nov. 30, 2009  (CN) ...................... 2009 2 0316180 U

(51) Int. Cl.
*A47B 81/00* (2006.01)
(52) U.S. Cl. ..................................... 312/223.2; 361/818
(58) Field of Classification Search ............... 312/223.2, 312/265.5, 265.6, 263, 215, 222; 292/24, 292/25, 31, 32, 42, 95, 96, 101, 106, DIG. 11, 292/300; 24/458; 361/724–727, 679.02, 361/816, 818; 174/377, 373, 382, 354, 355, 174/359
See application file for complete search history.

(56) References Cited

U.S. PATENT DOCUMENTS

| | | | | |
|---|---|---|---|---|
| 4,759,466 A * | 7/1988 | Chase et al. | ................. | 220/4.02 |
| 4,762,966 A * | 8/1988 | Kosanda | ....................... | 174/369 |
| 5,420,760 A * | 5/1995 | Ansell et al. | .................. | 361/818 |
| 5,491,611 A * | 2/1996 | Stewart et al. | ................ | 361/736 |
| 5,593,219 A * | 1/1997 | Ho | ................................. | 312/263 |
| 5,917,147 A * | 6/1999 | Lewis | ........................... | 174/354 |
| 5,952,608 A * | 9/1999 | Kim | ............................. | 174/354 |
| 5,992,955 A * | 11/1999 | Yang | ......................... | 312/265.6 |
| 6,140,577 A * | 10/2000 | Rapaich et al. | .............. | 174/365 |
| 6,231,140 B1 * | 5/2001 | Chen | ......................... | 312/223.2 |
| 6,278,606 B1 * | 8/2001 | Schmitt et al. | ........... | 361/679.35 |
| 6,362,975 B1 * | 3/2002 | Liu et al. | ....................... | 361/796 |
| 6,367,896 B1 * | 4/2002 | Peng et al. | .................. | 312/223.2 |
| 6,375,288 B1 * | 4/2002 | Chen | ......................... | 312/223.2 |
| 6,382,744 B1 * | 5/2002 | Xiao | .......................... | 312/223.2 |
| 6,816,391 B2 * | 11/2004 | Davis et al. | .................. | 361/818 |
| 2007/0210684 A1 * | 9/2007 | Lin et al. | .................... | 312/223.2 |
| 2007/0222347 A1 * | 9/2007 | Chen et al. | ................. | 312/223.2 |
| 2008/0174946 A1 * | 7/2008 | Chen et al. | ..................... | 361/683 |

* cited by examiner

*Primary Examiner* — Darnell Jayne
*Assistant Examiner* — Sasha T Varghese
(74) *Attorney, Agent, or Firm* — Altis Law Group, Inc.

(57) ABSTRACT

A computer enclosure includes a cover and a chassis. The cover includes a clasp. The chassis includes a flange. The flange defines an engaging hole and a cutout adjacent to the engaging hole. An edge of the cutout extends in the cutout to form an elastic clip. The clip includes a driving portion which is located below the flange. The clasp penetrates the engaging hole to engage with the driving portion, and simultaneously pushes the driving portion to place the clip in contact with the cover.

17 Claims, 6 Drawing Sheets

COMPUTER ENCLOSURE WITH EMI SHIELDING CLIP

BACKGROUND

1. Technical Field

The present disclosure relates to computer enclosures, and more particularly, to a computer enclosure with an electromagnetic interference (EMI) shielding clip.

2. Description of Related Art

Equipped with removable covers, computer enclosures incorporate such electronic components as disk storage and PCI cards normally encased within a metal enclosure. Despite providing an "outer skin" for the computer, the covers are themselves unshielded. The encased electronic components are prone to conductive electromagnetic signal leakage from the covers. Such electromagnetic emissions can significantly impact performance of other electronic components outside the enclosure, and components within the enclosure can be affected by the emissions of the electronic components from outside the enclosure. Thus, shielding components of highly conductive material in a sealed enclosure is necessary.

A common response to this necessity is to use compliant spring fingers around the perimeter of the cover to make grounding contact with the computer enclosure in order to lock in the electromagnetic emissions within the enclosure. The spring fingers are made of electrically conductive material, and through the use of fingers around the edges of the cover or base enclosure, grounding contact is achieved via the fingers when the cover is installed. However, after the spring fingers are used for a long time, the fingers are easily plastically deformed. As such, the grounding contact is influenced to depress the EMI shielding the enclosure.

Therefore, there is room for improvement within the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
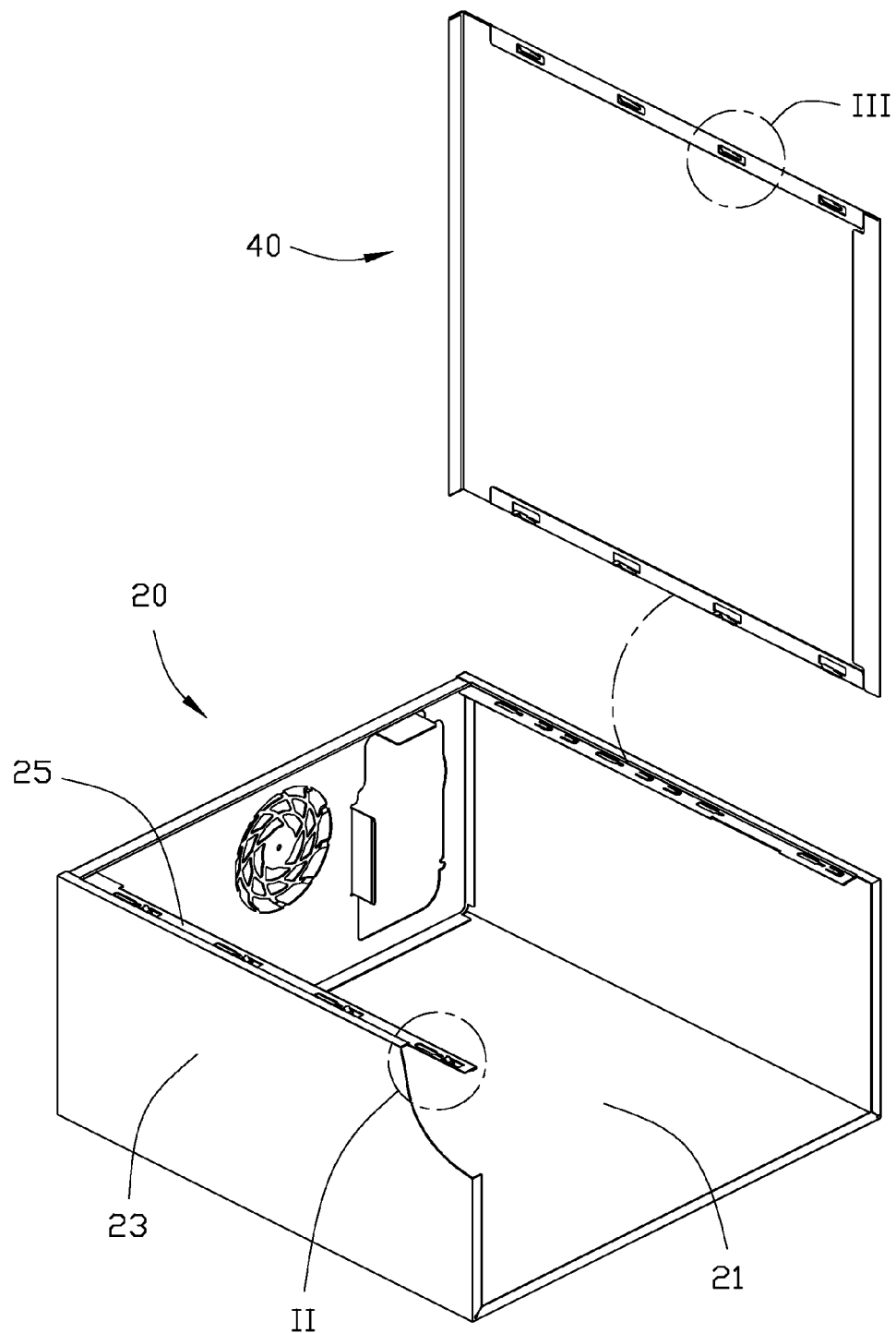
FIG. 1 is an exploded view of a computer enclosure in accordance with an embodiment of the present disclosure.
Figure 2:
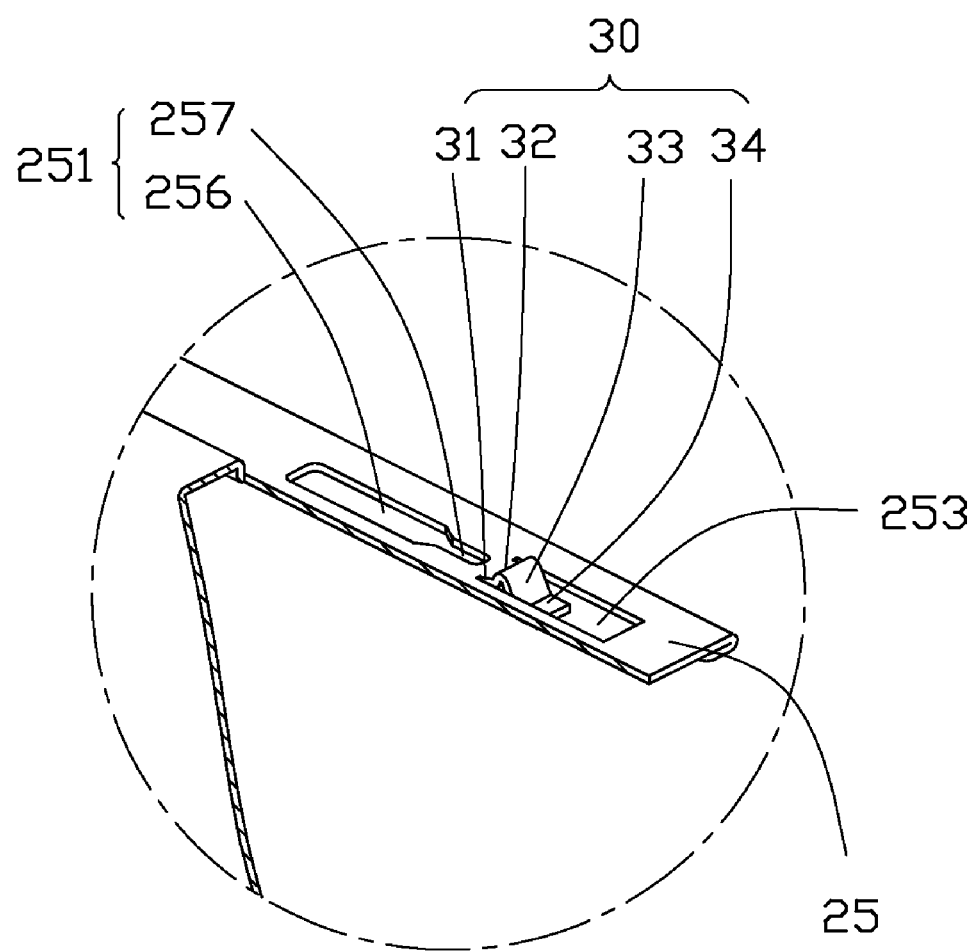
FIG. 2 is an enlarged view of circled portion II of FIG. 1.

Referring to FIGS. 1 and 2, a computer enclosure includes a chassis 20 and a cover 40. The chassis 20 includes a bottom panel 21 and a pair of side panels 23 extending from opposite edges of the bottom panel 21. Top edges of the bottom panel 21 are bent towards each other to form a pair of flanges 25. Each flange 25 defines a plurality of engaging holes 251 therein. Each engaging hole 251 includes a wide insert hole 256 and a narrow restricting hole 257.

The flange 25 defines a cutout 253 adjacent to each engaging hole 251. An edge of the cutout 253, which is adjacent to the restricting hole 257, extends in the cutout 253 to form an elastic EMI shielding clip 30. The clip 30 includes a connection portion 31, a contacting portion 32, an extending portion 33, and a driving portion 34. The connection portion 31 is connected to the edge of the cutout 253. The contacting portion 32 tilts upwardly from the connection portion 31. The extending portion 33 extends downwardly from a free end of the contacting portion 32. A free end of the extending portion 33 extends through the cutout 253, and is located below the flange 25. The driving portion 34 extends substantially parallel to the flange 25, and connects with the free end of the extending portion 33 via an arc-shaped transition portion 35 (see FIG. 5).

Figure 3:
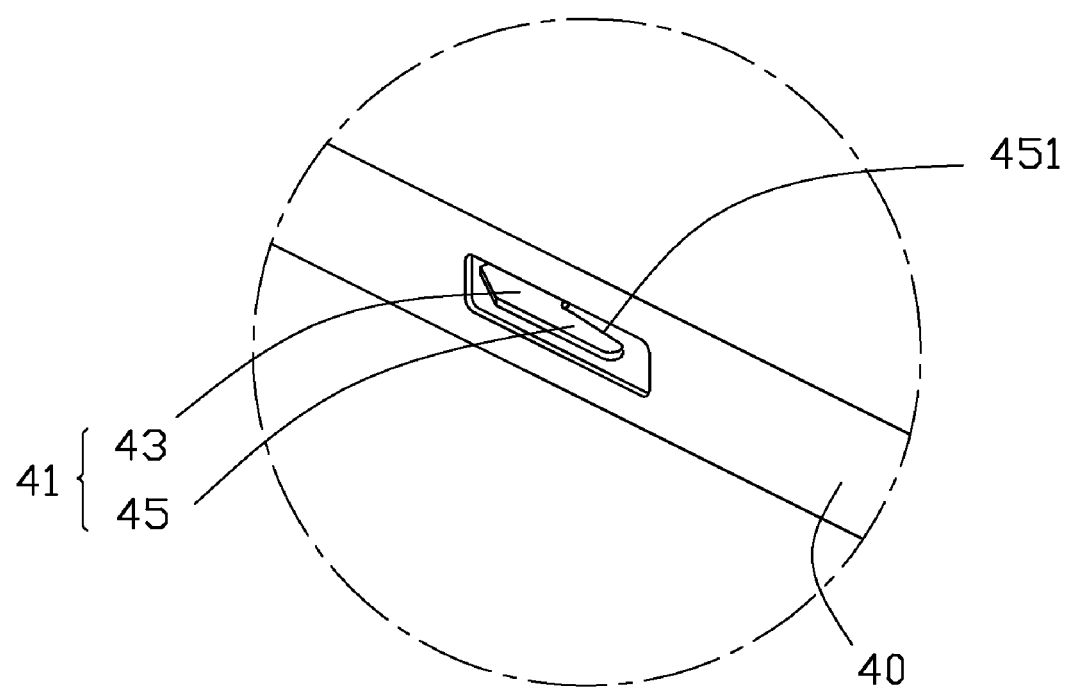
FIG. 3 is an enlarged view of circled portion III of FIG. 1.

Referring to FIGS. 1 to 3, the cover 40 is capable of being mounted on the flanges 25 of the pair of side panels 23. A bottom side of the cover 40 forms a plurality of clasps 41 corresponding to the engaging holes 251 of the flanges 25. Each clasp 41 includes a root portion 43 and an engaging portion 45. The root portion 43 is connected to the cover 40, and the engaging portion 45 extends from a free end of the root portion 43. The engaging portion 45 has a slope 451 formed thereon facing the cover 40. A distance between the cover 40 and an end of the slope 451, which connects to the root portion 43, is smaller than that between the cover 40 and the other end of the slope 451 which is free.

Figure 4:
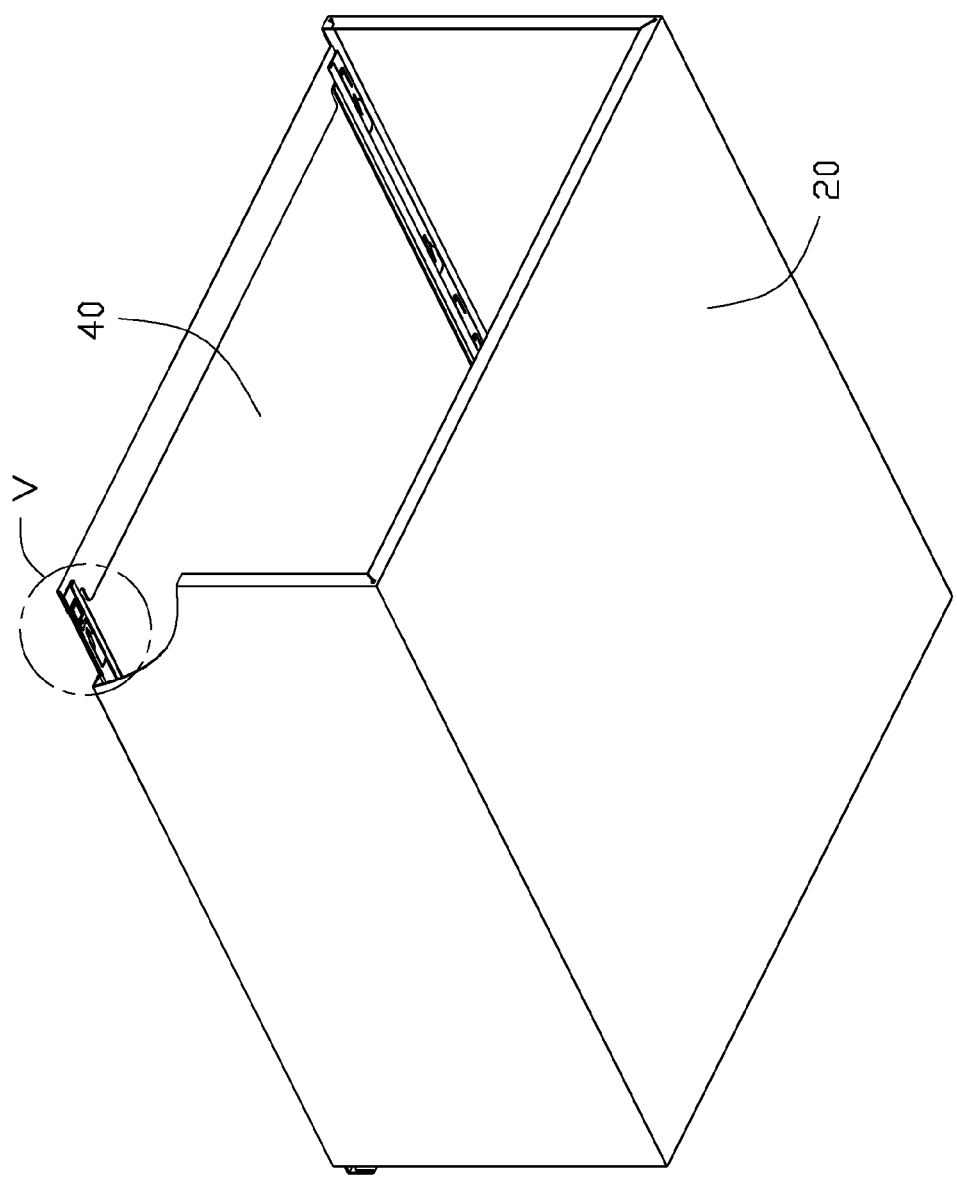
FIG. 4 is a partially assembled view of the computer enclosure of FIG. 1.
Figure 5:
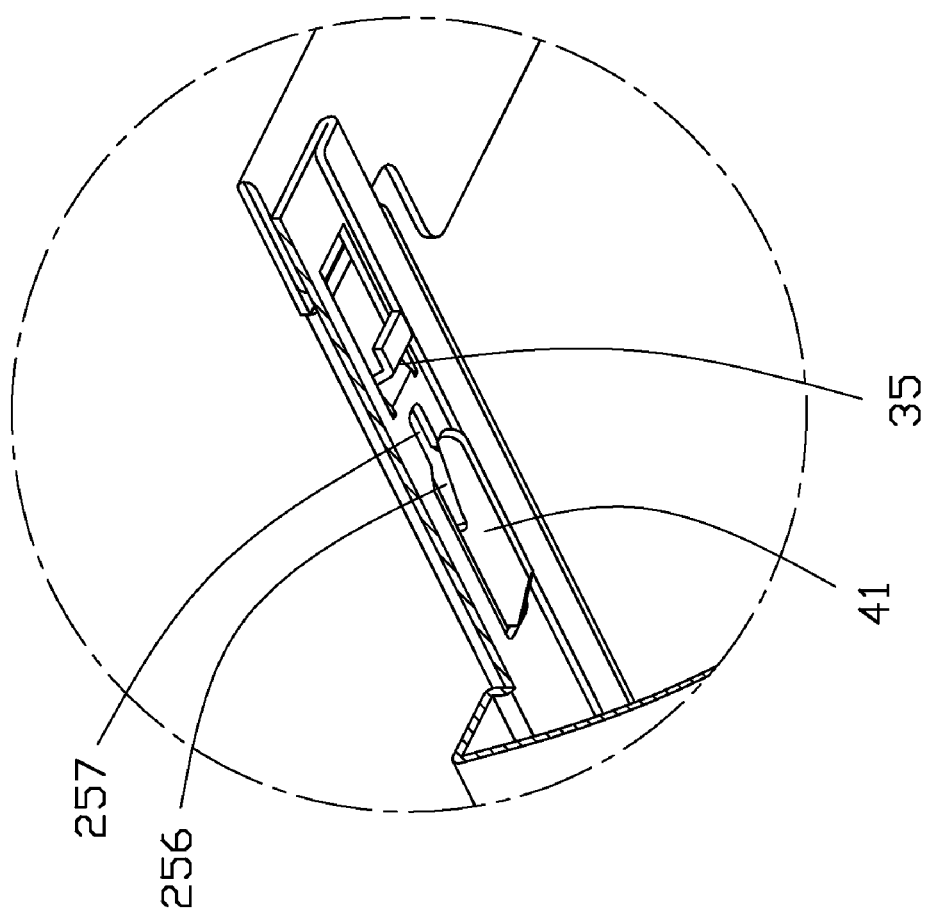
FIG. 5 is an enlarged view of circled portion V of FIG. 4.
Figure 6:
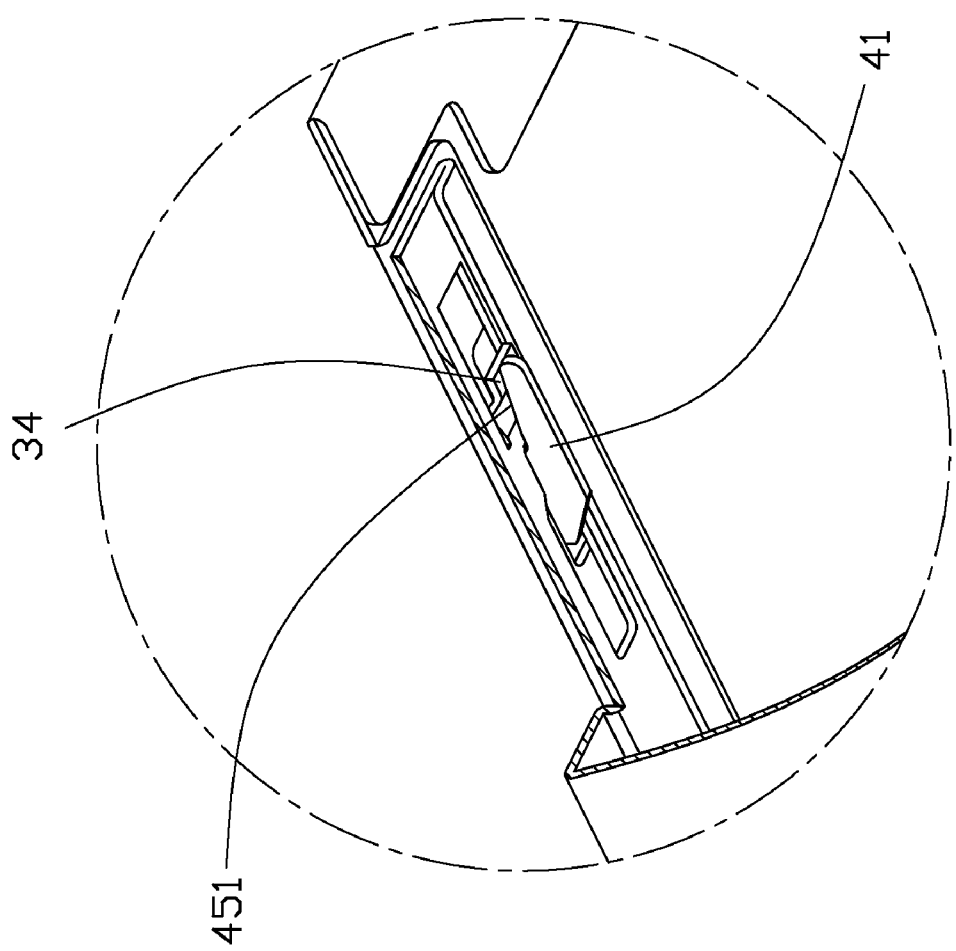
FIG. 6 is a view of another state of the cover with the chassis of FIG. 5.

Referring to FIGS. 4 to 6, to attach the cover 40 to the chassis 20, the cover 40 is placed on the flanges 25 of the side panels 23. The clasps 41 of the cover 40 are inserted in the insert holes 256 of the flanges 25. The cover 40 slides on the flanges 25. The root portion 43 of the clasp 41 slides from the insert hole 256 to the restricting hole 257. Simultaneously, the transition portion 35 of the clip 30 will act to guide the slope 451 of the clasp 41 to engage with the driving portion 34 of the clip 30. The driving portion 34 is pushed towards the cover 40 by the slope 451. Therefore, the clip 30 is bent towards the cover 40, and the contacting portion 32 of the clip 30 firmly makes contact with the cover 40 to achieve the EMI shielding. Because the root portion 43 of the clasp 41 slides in the restricting hole 257, the engaging portion 45 of the clasp 41 is located below the flange 25 to have the clasp 41 clasped on the flange 25. The cover 40 is then secured onto the chassis 20 by conventional means, such as screwing.

The clasp 41 engages with the flange 25, and simultaneously pushes the EMI shielding clip 30 into contact with the cover 40 to achieve EMI shielding. Even if the clip 30 is plastically deformed, the clasp 41 can still push the clip 30 into contact with the cover 40.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the present disclosure to the full extent indicated by the broad general meaning of the terms in which the appended claims are expressed.

What is claimed is:

1. A computer enclosure, comprising:
   a cover comprising a clasp; and
   a chassis comprising a pair of flanges, each defining an engaging hole and a cutout adjacent to the engaging hole; an elastic clip, formed on an edge of the cutout, and the clip comprising a driving portion which is located below each flange;

wherein the clasp penetrates the engaging hole, and slides in the engaging hole to engage with the driving portion and simultaneously push the driving portion, and the clip contacts the cover to achieve EMI shielding.

2. The computer enclosure of claim 1, wherein the chassis comprises a bottom panel and a pair of side panels extending from opposite edges of the bottom panel; top edges of the pair of side panels are bent towards each other to form the pair of flanges; and the pair of flanges support the cover thereon.

3. The computer enclosure of claim 1, wherein the clasp comprises a root portion and an engaging portion connected with the root portion; the root portion is coupled to the cover, and the engaging portion comprises a slope which is capable of pushing the driving portion such that the clip contacts the cover.

4. The computer enclosure of claim 3, wherein the slope faces the cover, and a distance between the cover and an end of the slope, which connects to the root portion, is less than that between the cover and the other end of the slope, which is free.

5. The computer enclosure of claim 3, wherein the clip comprises an arc-shaped transition portion connected to the driving portion.

6. The computer enclosure of claim 5, wherein the clip comprises a connection portion connected to the edge of the cutout; a free end of the connection portion tilts upwardly to form a contacting portion which contacts the cover.

7. The computer enclosure of claim 6, wherein a free end of the contacting portion extends downwardly and through the cutout to form an extending portion, and the transition portion is connected with an end of the extending portion which is located below each flange.

8. The computer enclosure of claim 1, wherein the engaging hole comprises an insert hole and a restricting hole communicating with the insert hole, the restricting hole restricts the clasp received therein, and the insert hole is capable of receiving the clasp inserted therein such that the clasp slides into the restricting hole.

9. A computer enclosure, comprising:

a cover comprising a clasp, the clasp comprising an engaging portion which has a slope;

a chassis comprising a side panel, a flange formed on a top edge of the side panel, the flange defining a cutout therein, a clip formed on an edge of the cutout, and the clip comprising a driving portion below the flange;

wherein the cover is located on the flange, the clasp engages with the flange, and the slope engages the driving portion to bias the driving portion towards the cover and place the clip in contact with the cover to achieve EMI shielding.

10. The computer enclosure of claim 9, wherein the flange further defines an engaging hole adjacent to the cutout, and the engaging hole receives the clasp inserted therein.

11. The computer enclosure of claim 10, wherein the engaging hole comprises an insert hole and a restricting hole communicating with the insert hole, the restricting hole restricts the clasp received therein, and the insert hole is capable of receiving the clasp inserted therein to such that the clasp slides into the restricting hole.

12. The computer enclosure of claim 10, wherein the chassis comprises a bottom panel and a pair of side panels extending from opposite edges of the bottom panel; and a top edge of one of the pair of side panels is bent to form the flange.

13. The computer enclosure of claim 9, wherein the clasp comprises a root portion, the root portion is coupled to the cover, and the engaging portion is connected with the root portion.

14. The computer enclosure of claim 9, wherein the slope faces the cover, and a distance between the cover and an end of the slope, which connects to the root portion, is less than that between the cover and the other end of the slope, which is free.

15. The computer enclosure of claim 13, wherein the clip comprises an arc-shaped transition portion connected to the driving portion.

16. The computer enclosure of claim 15, wherein the clip comprises a connection portion connected to the edge of the cutout; a free end of the connection portion tilts upwardly to form a contacting portion which contacts the cover.

17. The computer enclosure of claim 16, wherein a free end of the contacting portion extends downwardly and through the cutout to form an extending portion, and the transition portion is connected with an end of the extending portion which is located below the flange.

\* \* \* \* \*

UNITED STATES PATENT AND TRADEMARK OFFICE
CERTIFICATE OF CORRECTION

PATENT NO. : 8,016,372 B2  Page 1 of 1
APPLICATION NO. : 12/712179
DATED : September 13, 2011
INVENTOR(S) : Chin-Wen Yeh and Zhi-Jian Peng It is certified that error appears in the above-identified patent and that said Letters Patent is hereby corrected as shown below:

Title Page;
Please replace Section (75) regarding "Inventors" on the front page of the Patent with the following:

(75) Inventors: Chin-Wen Yeh, Taipei Hsien (TW); Zhi-Jian Peng, Shenzhen (CN)

Signed and Sealed this
Twenty-second Day of November, 2011

David J. Kappos
*Director of the United States Patent and Trademark Office*